United States Patent
Chu et al.

(10) Patent No.: US 7,327,475 B1
(45) Date of Patent: Feb. 5, 2008

(54) MEASURING A PROCESS PARAMETER OF A SEMICONDUCTOR FABRICATION PROCESS USING OPTICAL METROLOGY

(75) Inventors: Hanyou Chu, Palo Alto, CA (US); Vi Vuong, Fremont, CA (US); Yan Chen, Santa Clara, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/639,515

(22) Filed: Dec. 15, 2006

(51) Int. Cl.
*G06F 19/00* (2006.01)
*H01L 21/66* (2006.01)

(52) U.S. Cl. ............ 356/625; 356/446; 356/601; 702/57; 702/189; 700/121; 438/14

(58) Field of Classification Search .......... 356/446, 356/601, 625, 237.1, 237.2–237.5; 438/14; 702/189, 57
See application file for complete search history.

(56) References Cited

U.S. PATENT DOCUMENTS

| | | | |
|---|---|---|---|
| 6,785,638 B2 | 8/2004 | Niu et al. | |
| 6,891,626 B2 | 5/2005 | Niu et al. | |
| 6,917,849 B1 * | 7/2005 | Pasadyn et al. | 700/121 |
| 6,943,900 B2 | 9/2005 | Niu et al. | |
| 7,126,700 B2 * | 10/2006 | Bao et al. | 356/625 |
| 2004/0101983 A1 * | 5/2004 | Jones et al. | 438/14 |
| 2004/0267397 A1 | 12/2004 | Doddi et al. | |
| 2006/0082766 A1 * | 4/2006 | Kim et al. | 356/237.2 |

* cited by examiner

*Primary Examiner*—Gregory J. Toatley, Jr.
*Assistant Examiner*—Rebecca C. Slomski
(74) *Attorney, Agent, or Firm*—Morrison & Foerster LLP

(57) ABSTRACT

To measure a process parameter of a semiconductor fabrication process, the fabrication process is performed on a first area using a first value of the process parameter. The fabrication process is performed on a second area using a second value of the process parameter. A first measurement of the first area is obtained using an optical metrology tool. A second measurement of the second area is obtained using the optical metrology tool. One or more optical properties of the first area are determined based on the first measurement. One or more optical properties of the second area are determined based on the second measurement. The fabrication process is performed on a third area. A third measurement of the third area is obtained using the optical metrology tool. A third value of the process parameter is determined based on the third measurement and a relationship between the determined optical properties of the first and second areas.

41 Claims, 2 Drawing Sheets

MEASURING A PROCESS PARAMETER OF A SEMICONDUCTOR FABRICATION PROCESS USING OPTICAL METROLOGY

BACKGROUND

1. Field

The present application generally relates to optical metrology, and, more particularly, to measuring a process parameter of a semiconductor fabrication process using optical metrology.

2. Related Art

Optical metrology involves directing an incident beam at a structure, measuring the resulting diffracted beam, and analyzing the diffracted beam to determine a feature of the structure. In semiconductor manufacturing, optical metrology is typically used for quality assurance. For example, after fabricating a structure on a semi-conductor wafer an optical metrology tool is used to determine the profile of the structure. By determining the profile of the structure, the quality of the fabrication process utilized to form the structure can be evaluated.

Optical metrology has been used to evaluate, monitor, or control a semiconductor fabrication process by determining whether the profiles of the structures formed by the semiconductor fabrication process are within acceptable tolerances. Optical metrology, however, has not been used to measure a process parameter used in performing the semiconductor fabrication process.

SUMMARY

In one exemplary embodiment, to measure a process parameter of a semiconductor fabrication process, the fabrication process is performed on a first area using a first value of the process parameter. The fabrication process is performed on a second area using a second value of the process parameter. A first measurement of the first area is obtained using an optical metrology tool. A second measurement of the second area is obtained using the optical metrology tool. One or more optical properties of the first area are determined based on the first measurement. One or more optical properties of the second area are determined based on the second measurement. The fabrication process is performed on a third area. A third measurement of the third area is obtained using the optical metrology tool. A third value of the process parameter is determined based on the third measurement and a relationship between the determined optical properties of the first and second areas.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
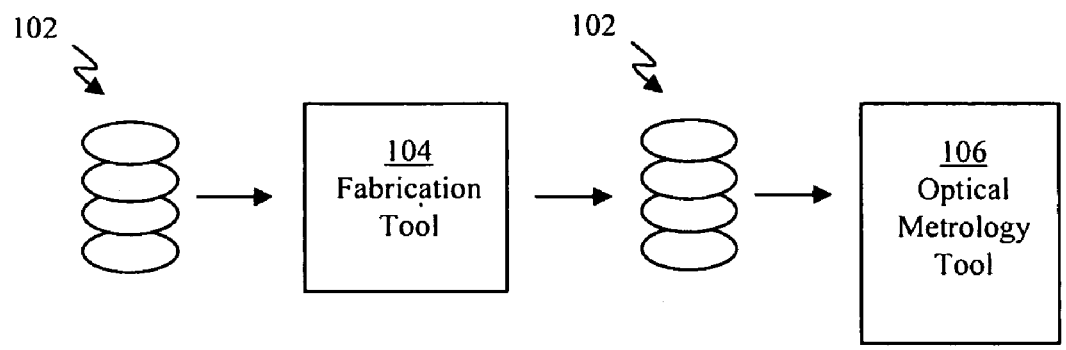
FIG. 1 depicts an exemplary fabrication tool and an exemplary optical metrology tool.

FIG. 1 depicts one or more wafers 102 processed in an exemplary fabrication tool 104. One or more semiconductor fabrication processes can be performed on one or more wafers 102 in fabrication tool 104. Typically a number of wafers 102 are processed as a batch, commonly referred to as a wafer lot, in fabrication tool 104. For example, a wafer lot of 25 wafers 102 can be processed as a batch in fabrication tool 104. It should be recognized, however, that the number of wafer 102 in a wafer lot can vary.

One or more process parameters are used in performing the one or more semiconductor fabrication processes. Typically, the one or more process parameters are set to define a recipe. Also, the same recipe (i.e., a setting of the one or more process parameters) is used to process the wafers in one wafer lot. One or more individual process parameters of a particular recipe can be adjusted while processing the wafers in one wafer lot. The one or more process parameters can also be set to different values to define different recipes. Different recipes can be used to process different wafer lots. Thus, one recipe can be used to process one wafer lot, and another recipe can be used to process another wafer lot.

For example, fabrication tool 104 can be a coater/developer tool, which is used to deposit and develop a photoresist layer on one or more wafers 102. The one or more process parameters used to perform the deposition and development processes can include temperature, spin speed, spin time, and the like. Thus, in this example, any one or more of these process parameters can be set to define any number of different recipes. The variation of a process parameter can produce a variation in the photoresist layer deposited and/or developed using fabrication tool 104. For example, different spin speeds can change the thickness and/or uniformity of the photoresist layer deposited on one or more wafers 102. It should be recognized that fabrication tool 104 can be various types of fabrication tools, such as a plasma etch tools, cleaning tools, chemical vapor deposition (CVD) tools, and the like.

As depicted in FIG. 1, after one or more semiconductor fabrication processes are performed on one or more wafers 102 in fabrication tool 104, one or more wafers 102 can be examined using optical metrology tool 106. As will be described in more detail below, optical metrology tool 106 can be used to determine one or more features of a structure formed on one or more wafers 102. Optical metrology tool 106 can also be used to measure a process parameter used in performing the semiconductor fabrication process on one or more wafers 102 in fabrication tool 104.

Figure 2:
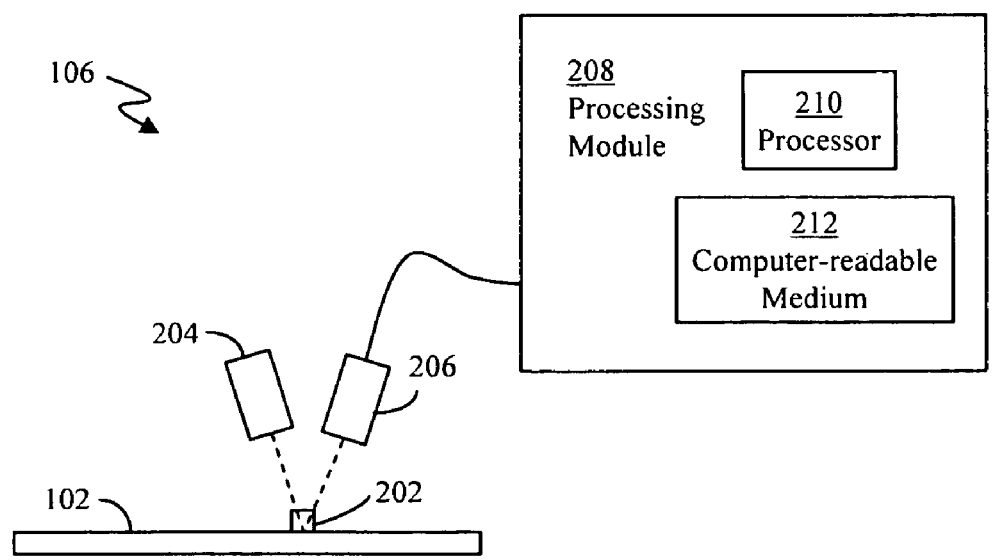
FIG. 2 depicts in more detail the exemplary optical metrology tool depicted in FIG. 1.

As depicted in FIG. 2, optical metrology tool 106 can include a photometric device with a source 204 and a detector 206. A structure 202 formed on wafer 102 is illuminated by an incident beam from source 204. Diffracted beams are received by detector 206. Detector 206 converts the diffracted beam into a measured diffraction signal, which can include reflectance, tan($\Psi$), cos($\Delta$), Fourier coefficients, and the like. Although a zero-order diffraction signal is depicted in FIG. 2, it should be recognized that non-zero orders can also be used.

Optical metrology tool 106 also includes a processing module 208 configured to receive the measured diffraction signal and analyze the measured diffraction signal. Processing module 208 can include a processor 210 and a computer-readable medium 212. It should be recognized, however, that processing module 208 can include any number of components in various configurations.

In one exemplary embodiment, processing module 208 is configured to determine one or more features of structure 202 using any number of methods which provide a best matching diffraction signal to the measured diffraction signal. These methods can include a library-based process, or a regression based process using simulated diffraction signals obtained by rigorous coupled wave analysis and machine learning systems. See, U.S. Pat. No. 6,943,900, titled GENERATION OF A LIBRARY OF PERIODIC GRATING DIFFRACTION SIGNALS, filed on Jul. 16, 2001, issued Sep. 13, 2005, which is incorporated herein by reference in its entirety; U.S. Pat. No. 6,785,638, titled METHOD AND SYSTEM OF DYNAMIC LEARNING THROUGH A REGRESSION-BASED LIBRARY GENERATION PROCESS, filed on Aug. 6, 2001, issued Aug. 31, 2004, which is incorporated herein by reference in its entirety; U.S. Pat. No. 6,891,626, titled CACHING OF INTRA-LAYER CALCULATIONS FOR RAPID RIGROUS COUPLED-WAVE ANALYSES, filed on Jan. 25, 2001, issued May 10, 2005, which is incorporated herein by reference in its entirety; and U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

Figure 3:
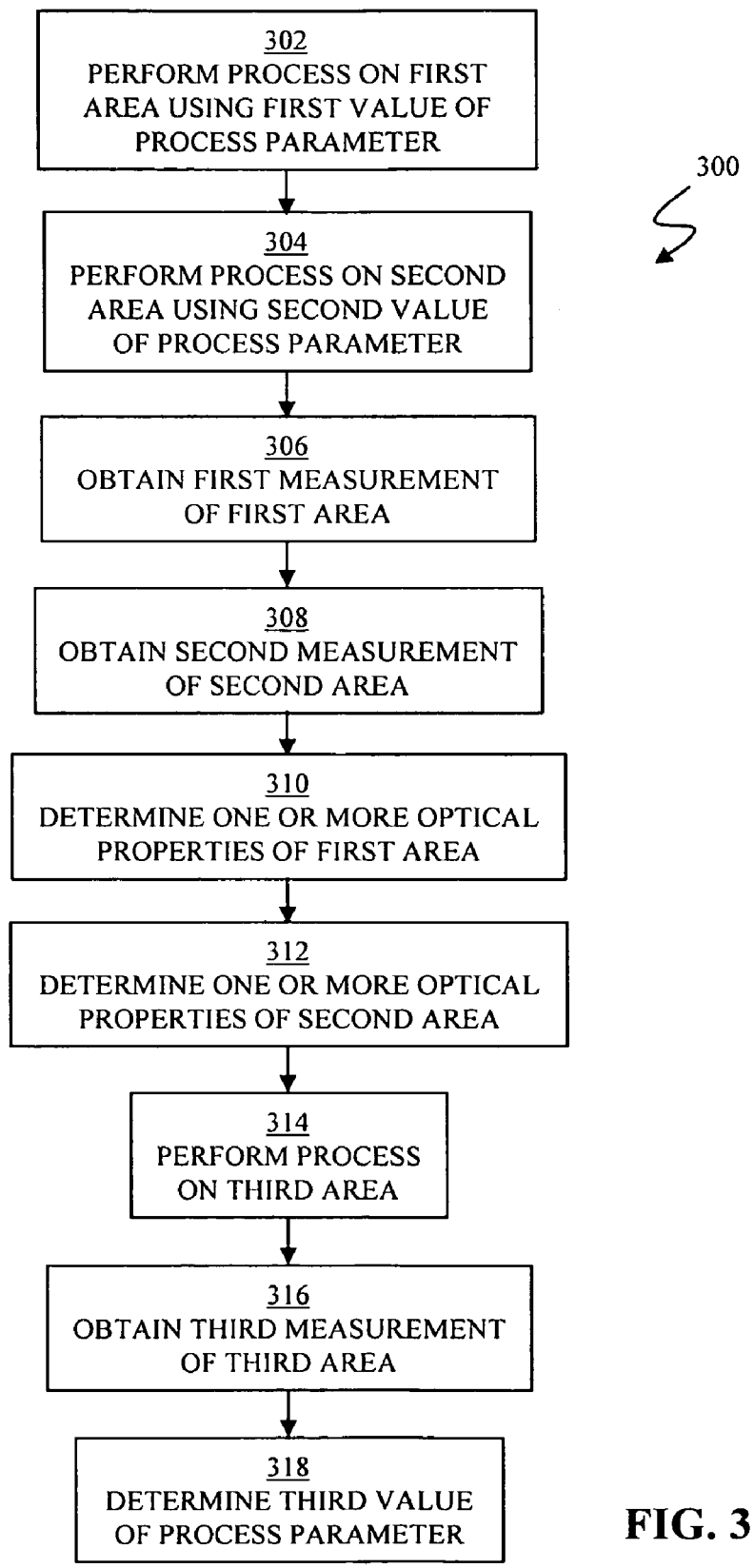
FIG. 3 depicts an exemplary process of measuring a process parameter used to perform a semiconductor fabrication process in the exemplary fabrication tool using the exemplary optical metrology tool depicted in FIG. 1.

In one exemplary embodiment, processing module 208 is configured to measure a process parameter used in performing the semiconductor fabrication process on one or more wafers 102 in fabrication tool 104 (FIG. 1). In particular, FIG. 3 depicts an exemplary process 300 to measure a process parameter of a semiconductor fabrication process.

In step 302, the semiconductor fabrication process is performed on a first area using a first value of the process parameter. For example, as described above, the semiconductor fabrication process can be a coater process in which a layer of photoresist is deposited on the wafer. Assume that the coater process involves spinning the wafer, and that the process parameter of interest is the spin speed. Thus, in the present example, assume that a photoresist layer is deposited on the first area using a first spin speed.

In step 304, the semiconductor fabrication process is performed on a second area using a second value of the process parameter. Returning to the example above in which the semiconductor fabrication process is a coater process and the process parameter is spin speed, assume that a photoresist layer is deposited on the second area using a second spin speed.

Note that in a typical coater process the layer of photoresist is deposited across the entire wafer. Thus, in the example above, the first area can correspond to a location on one wafer and the second area can correspond to a location on another wafer. It should be recognized, however, that some semiconductor fabrication processes can be performed specific to particular locations on a single wafer. Thus, the first and second areas can correspond to different locations on a single wafer. Also, the first and second areas can correspond to locations on different wafers in different wafer lots or the same wafer lot.

In step 306, a first measurement of the first area is obtained using an optical metrology tool. As described above, with reference to FIG. 2, an exemplary optical metrology tool 106 can include a photometric device with a source 204 and a detector 206. The first area can be illuminated by an incident beam from source 204. Diffracted beams from the first area are received by detector 206. Detector 206 converts the diffracted beam into a first measured diffraction signal, which can include reflectance, tan($\Psi$), cos($\Delta$), Fourier coefficients, and the like.

With reference again to FIG. 3, in step 308, a second measurement of the second area is obtained using the optical metrology tool. With reference again to FIG. 2, the second area can be illuminated by an incident beam from source 204. Diffracted beams from the second area are received by detector 206. Detector 206 converts the diffracted beam into a second measured diffraction signal, which can include reflectance, tan($\Psi$), cos($\Delta$), Fourier coefficients, and the like.

As noted above, the first and second areas can be different locations on a single wafer, locations on different wafers, and the different wafers can be in different wafer lots or the same wafer lot. In one exemplary embodiment, the first and second areas are thin film areas, which are un-patterned areas.

In step 310, one or more optical properties of the first area are determined based on the first measurement. As described above, with reference to FIG. 2, optical metrology tool 106 also includes a processing module 208 configured to receive the measured diffraction signal and analyze the measured diffraction signal. As also described above, processing module 208 can be configured to determine one or more features of structure 202 using any number of methods which provide a best matching diffraction signal to the measured diffraction signal. In the present embodiment, the one or more optical properties of the first area can be the one or more features determined by processing module 208 using the first measured diffraction signal. Additionally, as noted above, in one exemplary embodiment, the first area being examined is a thin film area rather than having structure 202.

With reference again to FIG. 3, in step 312, one or more optical properties of the second area are determined based on the second measurement. With reference again to FIG. 2, similar to the one or more optical properties of the first area, the one or more optical properties of the second area can be the one or more features determined by processing module 208 using the second measured diffraction signal. Additionally, as noted above, in one exemplary embodiment, the second area being examined is a thin film area rather than having structure 202.

With reference again to FIG. 3, in step 314, the semiconductor fabrication process is performed on a third area. Returning to the example above in which the semiconductor fabrication process is a coater process and the process parameter is spin speed, assume that a photoresist layer is deposited on the third area. Note, the third area can be a different location than the first and second areas on a single wafer, a location on a different wafer than the first and second area, and the different wafers can be in different wafer lots or the same wafer lot.

In step 316, a third measurement of the third area is obtained using the optical metrology tool. With reference again to FIG. 2, the third area can be illuminated by an incident beam from source 204. Diffracted beams from the third area are received by detector 206. Detector 206 converts the diffracted beam into a third measured diffraction signal, which can include reflectance, tan($\Psi$), cos($\Delta$), Fourier coefficients, and the like.

Note again that the third area can be a different location than the first and second areas on a single wafer, a location on a different wafer than the first and second area, and the different wafers can be in different wafer lots or the same wafer lot. In one exemplary embodiment, the third area is also a thin film area.

In step 318, a third value of the process parameter is determined based on the third measurement and a relationship between the determined optical properties of the first and second areas. In one exemplary embodiment, a range of potential values for the process parameter of interest is determined. The first value corresponds to the minimum value in the range. The second value corresponds to the maximum value in the range. The third value is within the range of potential values.

In one exemplary embodiment, the third value of the process parameter is determined using a mixing coefficient from the relationship between the determined optical properties of the first and second areas. The third value of the process parameter is determined using the determined mixing coefficient and a relationship between the first value and the second value of the process parameter.

For example, assume that the one or more optical properties of the first area include refractive index (n) and extinction coefficient (k) of the first area, which are commonly referred to as n & k. Assume also that the one or more optical properties of the second area include n & k of the second area, and the one or more optical properties of the third area include n & k of the third area. Thus, in this example, the n & k of the third area is determined using a relationship between the n & k determined of the first and second areas. In one exemplary embodiment, the n & k of the third area is determined using a mixing coefficient from the relationship between the determined n & k of the first and second areas. The third value of the process parameter is determined using the mixing coefficient and a relationship between the first value and the second value of the process parameter.

As a further example, assume that the relationship between the determined n & k of the first and second areas is expressed using an effective medium approximation (EMA) formula as follows:

$$\frac{\varepsilon - \varepsilon_h}{\varepsilon + \alpha\varepsilon_h} = \sum_{i=1}^{m} v_i \frac{\varepsilon_i - \varepsilon_h}{\varepsilon_i + \alpha\varepsilon_h}. \quad (1)$$

In equation (1), $v_i$, is a mixing coefficient, which can vary from 0 to 1. m is the number of areas measured. In the example above, m=2. It should be recognized, however, that any number of areas can be measured. $\varepsilon=(n+j*k)^2$, which is a complex function of n & k ($j=\mathrm{sqrt}(-1)$), and is called a dielectric constant.

Either or both sides of equation (1) can be simplified based on certain assumptions. For example, assuming a spherical microstructure, $\alpha$ can be assumed to be equal to 2. Also, one of the following can be assumed as well:

1) Linear assumption, where $\varepsilon=1$;
2) Maxwell-Garnet assumption, where $\varepsilon_h=\varepsilon_i$; or
3) Bruggeman assumption, $\varepsilon_h=\varepsilon$.

Thus, equation (1) can be solved for the mixing coefficient, $v_i$.

The optical properties used to solve equation (1) correspond to values of the process parameter of interest. In the example above, the optical properties correspond to two values of spin speed used in a deposition process. In particular, assume the first value of the process parameter is $S_1$, and the second value of the process parameter is $S_2$.

The mixing coefficient can also be used in defining a relationship between the values of the first and second process parameters. As an example, a linear relationship can be assumed, and the process parameter S can be defined using the relationship:

$$S=S_1+v(S_2-S_1). \quad (2)$$

It should be recognized, however, that the relationship between the values of the process parameters can be defined using various functions, including non-linear functions.

After solving for the mixing coefficient, $v$, in equation (1), the third value of the process parameter S can be solved using equation (2) by using the mixing coefficient, $v$, the first value of the process parameter, $S_1$, and the second value of the process parameter, $S_1$.

Alternatively, for two measured areas, equation (2) can be solved for the mixing coefficient, $v$, and substituted into equation (1). Equation (1), which now has the relationship between the values of the process parameters integrated into it, can then be solved for the process parameter of interest, S. Thus, the process parameter of interest, S, can be determined directly from the third measurement and the relationship between the determined optical properties integrated with the relationship between the values of the process parameters.

Although in the examples described above the relationship used to determine the value of the process parameter is based on the determined optical properties of two areas (the first and second areas), it should be recognized that the relationship can be determined based on optical properties of more than two areas. For example, the semiconductor fabrication process can be performed on three or more areas, measurements can be obtained from the three or more areas, and optical properties can be determined of the three of the more areas based on the measurements obtained from the three or more areas.

For more than two measured areas, equation (2) can be more generally expressed as follows:

$$S = \sum_{i=1}^{m} v_i S_i. \quad (3)$$

Also, the relationship between n & k and the process parameter can be expressed more generally using the following function:

$$\varepsilon=a_0+a_1 S+a_2 S^2+ \ldots +a_{m-1}S^{m-1}, \quad (4)$$

where m is the number of measured areas.

After the third value of the process parameter is determined, the third value can be used to adjust the semiconductor fabrication process performed in the fabrication tool. For example, with reference to FIG. 1, after determining the third value using optical metrology tool 106, the third value can be used to adjust the process parameter of the semiconductor fabrication process performed in fabrication tool 104.

In particular, as described above, in addition to determining the third value, optical metrology tool 106 can determine one or more features of a structure formed on one or more wafer 102. Thus, when the third value is determined for a particular wafer, one or more features of a structure formed on that particular feature can also be determined. If the one or more features are not within acceptable tolerances, then the process parameter of the semiconductor fabrication process performed in fabrication tool 104 can be adjusted based on the determined third value.

As a specific example, assume again that the semiconductor fabrication process is a deposition process to deposit a layer of photoresist and that the process parameter of interest is spin speed. After a layer of photoresist has been deposited on a wafer using fabrication tool 104, the thickness of the layer of photoresist can be determined as one of the features determined using optical metrology tool 106. A spin speed can also be determined for the wafer using optical metrology tool 106. If the determined thickness is not within acceptable tolerances (e.g., too thick or thin), then the spin speed used in the deposition process in fabrication tool 104 can be adjusted based on the determined spin speed.

Although fabrication tool 104 and optical metrology tool 106 are depicted in FIG. 1 as separate tools, it should be recognized that optical metrology tool 106 can be integrated into fabrication tool 104. For example, with reference to FIG. 2, source 204 and detector 206 of optical metrology tool 106 can be mounted on fabrication tool 104 (FIG. 1) to examine wafers 102 after they are processed in fabrication tool 104 (FIG. 1).

It should be recognized that the steps of process 300 (FIG. 3) can be performed by processor 210 based on computer-readable instructions stored on computer-readable medium 212. It should also be recognized, however, that the steps of process 300 (FIG. 3) can be performed using various combinations and configurations of hardware and/or software.

Although exemplary embodiments have been described, various modifications can be made without departing from the spirit and/or scope of the present invention. Therefore, the present invention should not be construed as being limited to the specific forms shown in the drawings and described above.

We claim:

1. A method of measuring a process parameter of a semiconductor fabrication process, the method comprising:

performing the semiconductor fabrication process on a first area using a first value of the process parameter;

performing the semiconductor fabrication process on a second area using a second value of the process parameter;

obtaining a first measurement of the first area using an optical metrology tool;

obtaining a second measurement of the second area using the optical metrology tool;

determining one or more optical properties of the first area based on the first measurement;

determining one or more optical properties of the second area based on the second measurement;

performing the semiconductor fabrication process on a third area;

obtaining a third measurement of the third area using the optical metrology tool; and determining a third value of the process parameter used to perform the semiconductor fabrication process on the third area based on the third measurement and a relationship between the determined optical properties of the first and second areas.

2. The method of claim 1, wherein determining a third value comprises:

determining a mixing coefficient from the third measurement and the relationship between the determined optical properties of the first and second areas; and determining the third value of the process parameter using the determined mixing coefficient and a relationship between the first value and the second value of the process parameter.

3. The method of claim 2, wherein the mixing coefficient is determined based on an interpolation between the optical properties of the first and second areas.

4. The method of claim 1, wherein a relationship between the first value and the second value of the process parameter is integrated into the relationship between the determined optical properties of the first and second areas, and wherein the third value of the process parameter is determined from the third measurement and the relationship between the determined optical properties of the first and second areas integrated with the relationship between the first value and the second value of the process parameter.

5. The method of claim 1, wherein the optical properties of the first area includes refractive index and extinction coefficient of the first area, and the optical properties of the second area includes refractive index and extinction coefficient of the second area.

6. The method of claim 1, wherein the first, second, and third measurements are obtained from thin film areas.

7. The method of claim 1, wherein the first and second measurements are diffraction signals measured using the optical metrology tool.

8. The method of claim 7, wherein the one or more optical properties of the first and second areas are determined by comparing the measured diffraction signals to one or more simulated diffraction signals.

9. The method of claim 1, wherein the first, second, and third areas are located on different portions of one wafer.

10. The method of claim 1, wherein the first, second, and third areas are located on different wafers.

11. The method of claim 10, wherein the different wafers are in different wafer lots.

12. The method of claim 10, wherein the different wafers are in the same wafer lot.

13. The method of claim 1, further comprising:

defining a range of potential values for the process parameter, the range having a minimum value and a maximum value, wherein the first value corresponds to the minimum value and the second value corresponds to the maximum value, and wherein the third value is within the range of potential values.

14. The method of claim 1, further comprising:

adjusting the semiconductor fabrication process based on the determined third value.

15. A method of measuring a process parameter of a semiconductor fabrication process, the method comprising:

obtaining a first measurement of a first area using an optical metrology tool, wherein the semiconductor fabrication process was performed on the first area using a first value of the process parameter;

obtaining a second measurement of the second area using the optical metrology tool, wherein the semiconductor fabrication process was performed on the second area using a second value of the process parameter that is different than the first value;

determining one or more optical properties of the first area based on the first measurement;

determining one or more optical properties of the second area based on the second measurement;

obtaining a third measurement of a third area using the optical metrology tool, wherein the semiconductor fabrication process was performed on the third area, and wherein the third area is different than the first and second areas; and determining a third value of the process parameter used to perform the semiconductor fabrication process on the third area based on the third measurement and a relationship between the determined optical properties of the first and second areas.

16. The method of claim 15, wherein determining a third value comprises:
   determining a mixing coefficient from the third measurement and the relationship between the determined optical properties of the first and second areas; and
   determining the third value of the process parameter using the determined mixing coefficient and a relationship between the first value and the second value of the process parameter.

17. The method of claim 16, wherein the mixing coefficient is determined based on an interpolation between the optical properties of the first and second areas.

18. The method of claim 15, wherein a relationship between the first value and the second value of the process parameter is integrated into the relationship between the determined optical properties of the first and second areas, and wherein the third value of the process parameter is determined from the third measurement and the relationship between the determined optical properties of the first and second areas integrated with the relationship between the first value and the second value of the process parameter.

19. The method of claim 15, wherein the optical properties of the first area includes refractive index and extinction coefficient of the first area, and the optical properties of the second area includes refractive index and extinction coefficient of the second area.

20. The method of claim 15, wherein the first, second, and third measurements are obtained from thin film areas.

21. The method of claim 15, wherein the first and second measurements are diffraction signals measured using the optical metrology tool.

22. The method of claim 21, wherein the one or more optical properties of the first and second areas are determined by comparing the measured diffraction signals to one or more simulated diffraction signals.

23. The method of claim 15, wherein the first, second, and third areas are located on different portions of one wafer.

24. The method of claim 15, wherein the first, second, and third areas are located on different wafers.

25. The method of claim 24, wherein the different wafers are in different wafer lots.

26. The method of claim 24, wherein the different wafers are in the same wafer lot.

27. The method of claim 15, further comprising:
   defining a range of potential values for the process parameter, the range having a minimum value and a maximum value, wherein the first value corresponds to the minimum value and the second value corresponds to the maximum value, and wherein the third value is within the range of potential values.

28. The method of claim 15, further comprising:
   adjusting the semiconductor fabrication process based on the determined third value.

29. A computer-readable storage medium having computer executable instructions to measure a process parameter of a semiconductor fabrication process, comprising instructions for:
   obtaining a first measurement of a first area using an optical metrology tool, wherein the semiconductor fabrication process was performed on the first area using a first value of the process parameter;
   obtaining a second measurement of the second area using the optical metrology tool, wherein the semiconductor fabrication process was performed on the second area using a second value of the process parameter that is different than the first value;
   determining one or more optical properties of the first area based on the first measurement;
   determining one or more optical properties of the second area based on the second measurement;
   obtaining a third measurement of a third area using the optical metrology tool, wherein the semiconductor fabrication process was performed on the third area, and wherein the third area is different than the first and second areas; and
   determining a third value of the process parameter used to perform the semiconductor fabrication process on the third area based on the third measurement and a relationship between the determined optical properties of the first and second areas.

30. The computer-readable storage medium of claim 29, wherein determining a third value comprises instructions for:
   determining a mixing coefficient from the third measurement and the relationship between the determined optical properties of the first and second areas; and
   determining the third value of the process parameter using the determined mixing coefficient and a relationship between the first value and the second value of the process parameter.

31. The computer-readable storage medium of claim 29, wherein a relationship between the first value and the second value of the process parameter is integrated into the relationship between the determined optical properties of the first and second areas, and wherein the third value of the process parameter is determined from the third measurement and the relationship between the determined optical properties of the first and second areas integrated with the relationship between the first value and the second value of the process parameter.

32. The computer-readable storage medium of claim 29, wherein the optical properties of the first area includes refractive index and extinction coefficient of the first area, and the optical properties of the second area includes refractive index and extinction coefficient of the second area, and wherein the first and second measurements are diffraction signals measured using the optical metrology tool.

33. The computer-readable storage medium of claim 29, further comprising instructions for:
   defining a range of potential values for the process parameter, the range having a minimum value and a maximum value, wherein the first value corresponds to the minimum value and the second value corresponds to the maximum value, and wherein the third value is within the range of potential values.

34. The computer-readable storage medium of claim 29, further comprising:
   adjusting the semiconductor fabrication process based on the determined third value.

35. A system to measure a process parameter of a semiconductor fabrication process, the system comprising:
   a fabrication tool configured to perform the semiconductor fabrication process on a first area using a first value of the process parameter, a second area using a second value of the process parameter, and a third area; and
   an optical metrology tool configured to:

obtain a first measurement of the first area using an optical metrology tool;

obtain a second measurement of the second area using the optical metrology tool;

determine one or more optical properties of the first area based on the first measurement;

determine one or more optical properties of the second area based on the second measurement;

obtaining a third measurement of the third area; and determine a third value of the process parameter used to perform the semiconductor fabrication process on the third area based on the third measurement and a relationship between the determined optical properties of the first and second areas.

36. The system of claim 35, wherein the optical properties of the first area includes refractive index and extinction coefficient of the first area, and the optical properties of the second area includes refractive index and extinction coefficient of the second area, and wherein the first and second measurements are diffraction signals measured using the optical metrology tool.

37. The system of claim 35, wherein the first, second, and third areas are located on different portions of one wafer.

38. The system of claim 35, wherein the first, second, and third areas are located on different wafers.

39. The system of claim 38, wherein the different wafers are in different wafer lots.

40. The system of claim 38, wherein the different wafers are in the same wafer lot.

41. The system of claim 35, wherein the optical metrology tool is configured to adjust the semiconductor fabrication process based on the determined third value.

* * * * *